United States Patent [19]
Gönner et al.

[11] Patent Number: 5,791,406
[45] Date of Patent: Aug. 11, 1998

[54] COOLING DEVICE FOR ELECTRICAL OR ELECTRONIC COMPONENTS HAVING A BASE PLATE AND COOLING ELEMENTS AND METHOD FOR MANUFACTURING THE SAME

[75] Inventors: Johannes Gönner, Berg; Joachim Masatz, Höchstadt, both of Germany

[73] Assignee: Hoogovens Aluminium Profiltechnik, GmbH, Germany

[21] Appl. No.: 769,547

[22] Filed: Dec. 19, 1996

[51] Int. Cl.$^6$ ............................. H05K 7/20; H01L 23/36
[52] U.S. Cl. ...................... 165/185; 165/80.3; 361/704; 29/890.03
[58] Field of Search ................ 165/80.3, 185; 29/890.03; 174/16.3; 361/697, 704, 710

[56] References Cited

U.S. PATENT DOCUMENTS

| | | |
|---|---|---|
| 1,830,375 | 11/1931 | Shoop. |
| 5,499,459 | 3/1996 | Jacoby ............... 29/890.03 |
| 5,518,071 | 5/1996 | Lee ...................... 165/185 |

FOREIGN PATENT DOCUMENTS

| | | | |
|---|---|---|---|
| 0 278 240 A2 | 8/1988 | European Pat. Off. | |
| 0 123 795 B1 | 5/1990 | European Pat. Off. | |
| 0 483 058 A1 | 4/1992 | European Pat. Off. | |
| 0 612 105 A1 | 8/1994 | European Pat. Off. | |
| 1100057 | 2/1961 | Germany ........... | 165/185 |
| 25 02 472 C2 | 9/1982 | Germany. | |
| 35 18 310 C2 | 5/1989 | Germany. | |
| 41 06 437 A1 | 8/1991 | Germany. | |
| 92 15 145.0 | 3/1993 | Germany. | |
| 41 34 929 A1 | 4/1993 | Germany. | |
| 93 02 754.0 | 5/1993 | Germany. | |
| 94 09 517.5 | 9/1994 | Germany. | |
| 55-85049 | 6/1980 | Japan ............... | 165/185 |
| 60-257157 | 12/1985 | Japan ............... | 165/185 |
| 885150 | 12/1961 | United Kingdom. | |
| 92 14 061.0 | 2/1993 | United Kingdom. | |
| WO 87/02443 | 4/1987 | WIPO. | |

OTHER PUBLICATIONS

Transistor Heat Sink, J.B. Randolph, IBM Tech. Discl. Bul. vol. 14 No. 5 pp. 1489–1490, Oct. 1971.
IBM Technical Disclosure Bulletin, vol. 27, No. 10A, Mar. 1985, "Heat Sink Fabrication Method".
European Patent Office Search Report dated Jan. 24, 1996.
German Patent Office Search dated Feb. 20, 1995.
IBM Technical Disclosure Bulletin, vol. 25, No. 2, Jul. 1982; "Cooling Fin Structure", R. G. Biskeborn, J. L. Horvath and S. Oktay.
Patent Abstracts of Japan, E–650, Aug. 29, 1988, vol. 12/No. 318 for "Cooling Element and Manufacture Thereof".

*Primary Examiner*—Allen J. Flanigan
*Attorney, Agent, or Firm*—Wallenstein & Wagner Ltd.

[57] ABSTRACT

In order to improve the function and to simplify the manufacture of a cooling device for electrical or electronic components, rib-like cooling elements are positioned parallel and at a predetermined distance from one another and are connected to a base plate in heat-transmitting contact. At least two cooling elements are combined into a unitary ribbon-shaped package having a U-shaped profile in cross-section and a web portion which connects the cooling elements. The cooling elements being fixed to the base plate in corresponding longitudinal slots.

14 Claims, 3 Drawing Sheets

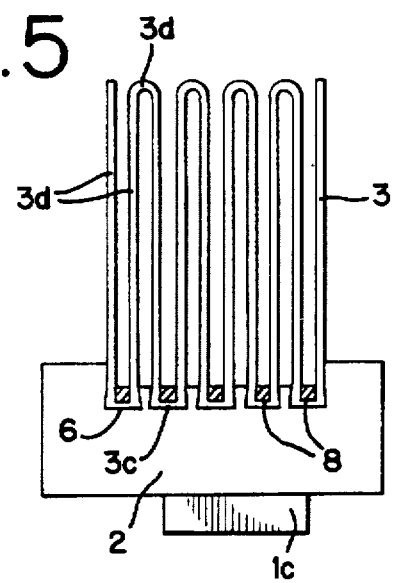
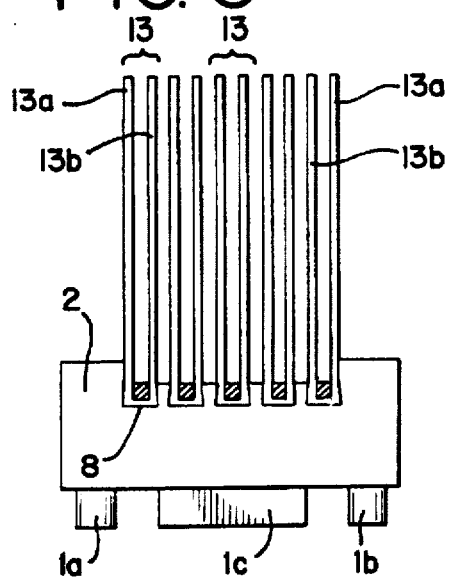
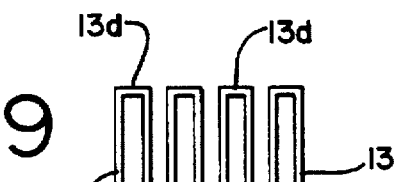
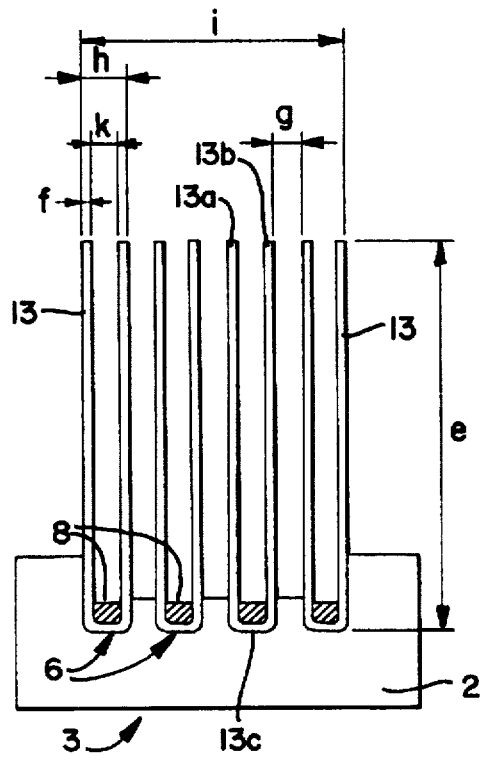
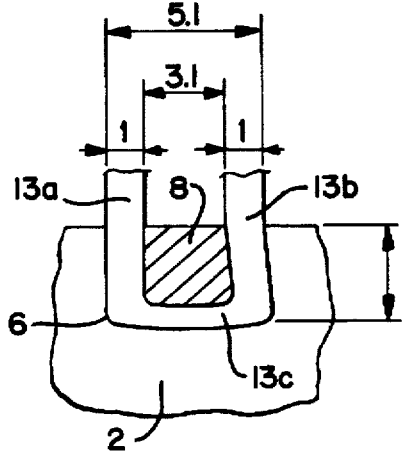

COOLING DEVICE FOR ELECTRICAL OR ELECTRONIC COMPONENTS HAVING A BASE PLATE AND COOLING ELEMENTS AND METHOD FOR MANUFACTURING THE SAME

DESCRIPTION

RELATED APPLICATION

This claims the benefit of U.S. Provisional application Ser. No. 60/008,932, filed Dec. 20, 1995, and U.S. Provisional application Ser. No. 60/016,049, filed Apr. 22, 1996.

TECHNICAL FIELD OF THE INVENTION

The present invention relates to a cooling device for electrical or electronic components, and to a method for manufacturing such a device.

BACKGROUND OF THE INVENTION

A cooling device of this type is already known (EP-A-0 483 058), having hollow bodies as cooling ribs. Its manufacture is relatively complex.

Another type of cooling device is known from DE-PS 25 02 472. Here, the rib-like cooling elements are made of aluminum plates, the ends of which are each pressed into parallel slots in the base plate. The slot walls have projections and indentations so that the cooling elements are firmly fixed after being pressed into the slots. The manufacture of this kind of heat sink is quite complex.

Furthermore, it is known from DE-PS 35 18 310 and EP-OS 0 483 058 that individual rib-like cooling elements can be fixed firmly in the base plate by pressing the intermediate web between the slots in the base plate against the wall of the cooling elements after the ends of the latter have been inserted, thereby reducing the width of the slots. It is recommended that the outer surfaces of the cooling elements, in the form either of plates or of hollow bodies, be given elevations and indentations so that the individual cooling elements can be better fixed in the base plate.

Moreover, it is known from DE-OS 41 06 437 to make cooling elements from thin wires. The individual wires are bent into a meander such that in each case one and the same wire constitutes an integral part of a large number of cooling elements; here a large number of such wires is arranged one behind the other in order to form rib-like structures. The thin wires are connected to the base plate by means of a metal joint. It is also known to blow a flow of coolant from above onto the rib-shaped structure consisting of the plurality of cooling wires.

It is also known (EP-PS 0 123 795) that individual cooling elements of cuboid cross-section can be made by obliquely cutting them out of a block which is itself cuboid. Milling grooves are provided in the block from both face ends in such a way that the crosssection of the work piece's remaining material is given a meandering form. Here, too, manufacture is relatively complex.

Further, it is known from DE-GM 92 14 061 and 93 02 754 that the cooling elements can be amalgamated into one package by joining one end of each of the cooling ribs to form a plate which, by means of a heat conducting paste, for example, is in turn in contact with the base plate comprising the electronic components such as semi-conductor elements or thyristors.

Furthermore it is known from U.S. Pat. No. 1, 830, 375 to fit ribbon-shaped meanders to both outer surfaces of a flat hollow tube and to fix them by means of a wire spiral.

Finally, it is known from WO87/02443 that the base of the web portion of U-shaped profiles can be welded onto a base plate in such way that the material of the profiles alloys itself to that of the base plate.

SUMMARY OF THE INVENTION

It is an object of the present invention to technically and functionally improve the cooling device of the class mentioned hereinabove and to simplify its manufacture.

According to the present invention at least two cooling elements are combined into a unitary package; this package consists of a ribbon of good heat-conducting material which has either been bent into a meandering or a serpentine shape so that adjacent windings each form rib-shaped cooling elements, or which has been formed into a U-shaped profile so that several, or in particular at least four of said U-profiles are arranged like segments of a comb next to and at a distance to one another on one side of the base plate. The distance between the profiles is far less than their expansion away from the base plate, i.e. than their overall height.

In the embodiment where the two cooling ribs are combined into one profile segment of U-shaped cross-section, the base of the profile member, i.e. the first web portion linking the two profile limbs, is fixed firmly in the respective longitudinal slot of the base plate resulting in surface contact with the inner walls of the longitudinal slot and good heat transmission.

For the manufacturing of the package of cooling elements, preference is given to using solder-coated ribbon-shaped sheet metal, on which the solder—by means of which the package is connected to the base plate—has already been plated in the form of a layer onto the supporting layer of good thermal conductivity, i.e., the sheet metal. Particular preference is given to a coated aluminum alloy such as the AlMn or AlMnMg type. Plated aluminum alloys of this kind are particularly suitable for sweating; they are made predominantly by rolling and, for the purposes of the present invention, are given their meander- or serpentine-shaped structure by bending, it being advisable that the solder layer on the outer surfaces of those meander ends which are to be joined to the base plate should be left bare.

In many cases, it suffices to put the package with its meander-shaped profile against one side—where the meander ends are—of the base plate and to solder it on there. As far as the manufacturing is concerned this is the least complicated method whilst still ensuring a good joint and sufficient heat transmission from the base plate to the meander-shaped package.

Instead of or complementary to the soldering joint, the meander-shaped ribbon or the profiles can be pressed into the longitudinal slots in the base plate by means of stretched pieces of wire, where they are permanently deformed and thus firmly fixed.

Heat transmission and fixing are improved yet further if the extruded base plate comprises longitudinal slots which are dovetailed in cross-section. Pieces of wire are used to insert a portion of the meander-shaped ribbon or U-shaped profiles to the wider ends of the dovetailed longitudinal slots in order to facilitate the joining of the meander-shaped ribbon or the U-shaped profiles to the base plate by squeezing or wedging and so that instead of just forming a good mechanical joint, the heat transmission resistance is further reduced even without soldering. In this manner, the cooling effect is further improved and the "profiles" can be prevented from coming off by themselves even if heated to a high temperature.

Other advantages and aspects of the invention will become apparent upon making reference to the specification, claims, and drawings to follow.

DESCRIPTION OF DRAWINGS

Embodiments of the present invention are described more detailed below with reference to the accompanying drawings in which:

FIGS. 5–7 are other cross-sectional views of the cooling device;

FIG. 8 is a magnified partial cross-sectional view of the area where either the ribbon or the profile is fixed in a base plate slot; and, FIG. 9 is a cross-sectional view of another embodiment of the present invention.

DETAILED DESCRIPTION OF THE INVENTION

Figure 1:
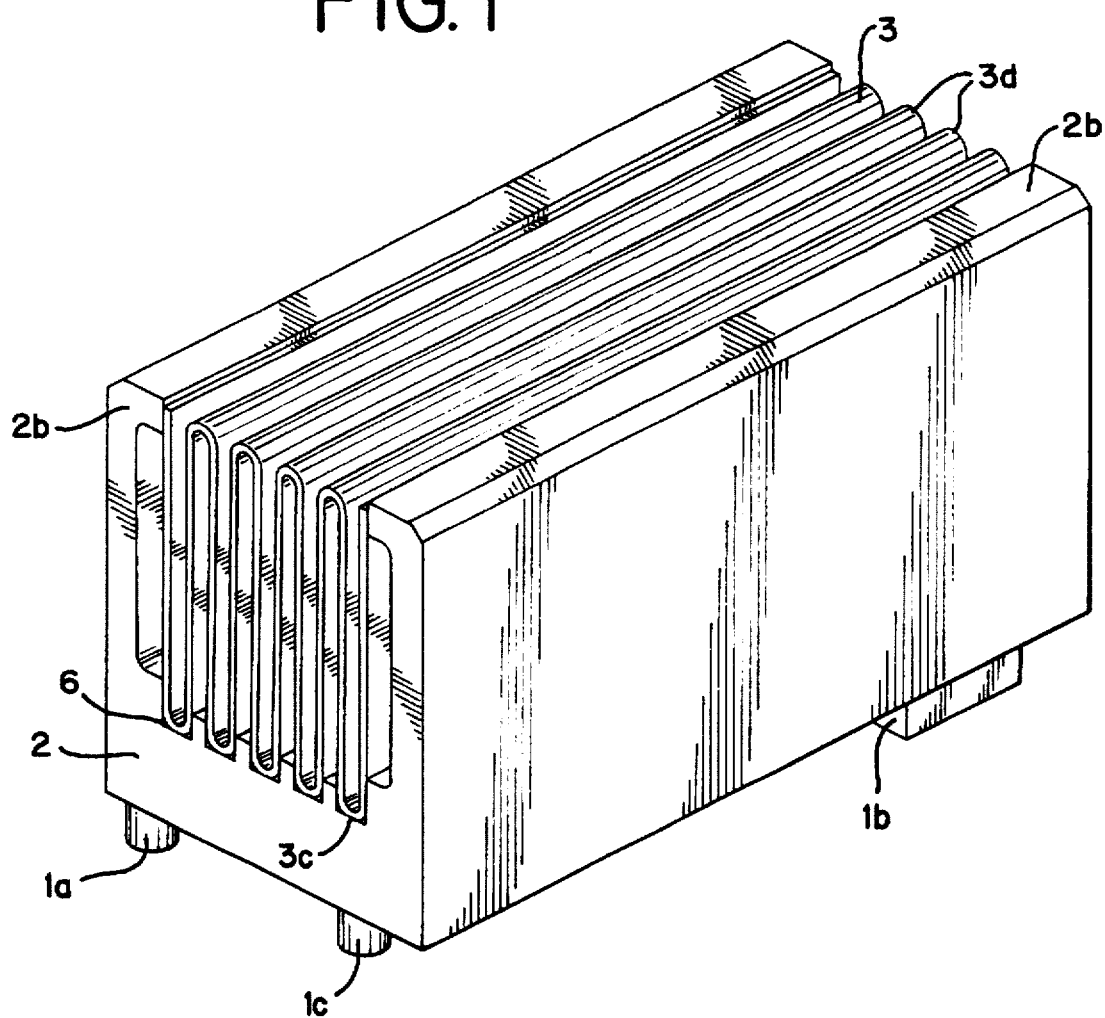
FIG. 1 is a diagram of a cooling device according to the present invention.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to embodiments illustrated.

According to FIG. 1, a series of electronic components 1a, 1b and 1c are fixed to a surface of the base plate 2 in such a way that the heat generated in the electronic components 1a, 1b and 1c is carried off easily onto the base plate 2. The base plate 2 is made of aluminum, for example, and it forms a profile segment together with the two side plates 2b laterally supporting the ribbon 10 (see FIG. 4) made of solder-plated or commercially available aluminum sheet metal and folded into a meandering shape to form the package 3 (shown in FIG. 1). The package 3 formed of the ribbon 10 is inserted into dovetailed longitudinal slots 6 (shown in FIG. 8) and soldered onto the base plate 2 with its meander ends 3c (also shown in FIG. 3), which in this example are bent into an approximately semicircular shape. A suitable soldering material should be one which is quick to solder with, while at the same time forms a mechanically firm joint and creates little heat transmission resistance between the base plate 2 and the package 3.

Figure 2:
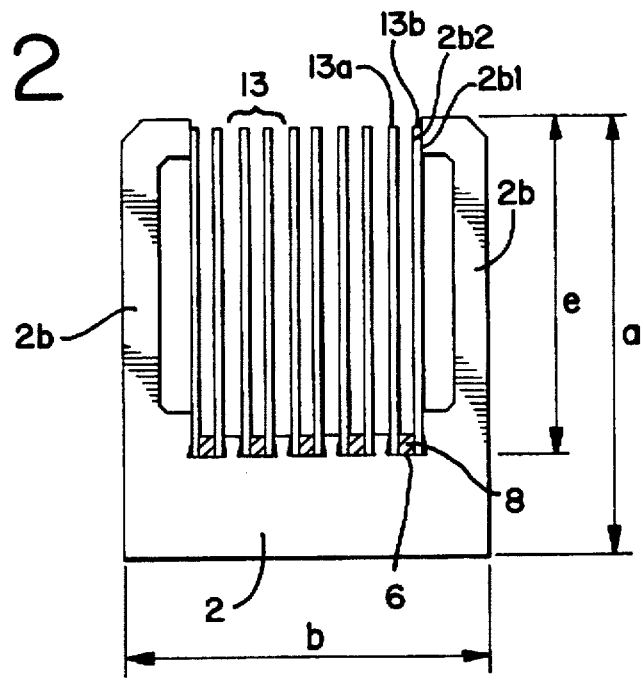
FIG. 2 is a cross-sectional view of the cooling device of another embodiment according to the present invention.
Figure 3:
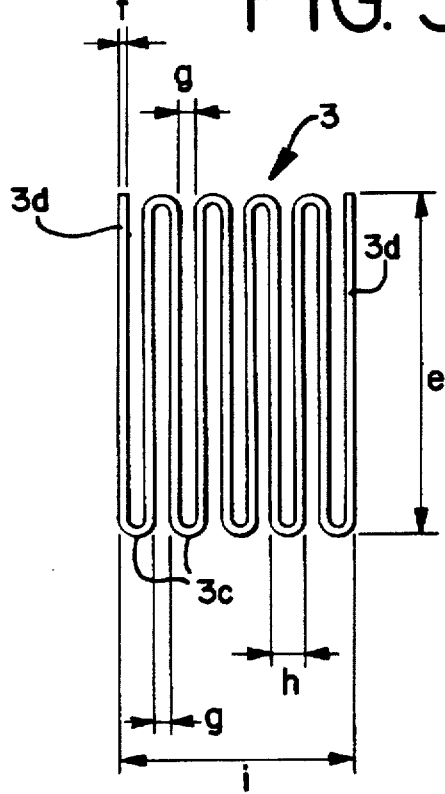
FIG. 3 is a cross-sectional view of individual cooling elements made of ribbon folded into a meandering shape and combined into a unitary package.

Representative dimensions of an embodiment according to the present invention as illustrated in FIGS. 2 and 3, are as follows:

a=60 mm b=47 mm e=48 mm f=1 mm g=2 mm h=4 mm i=approx. 30 mm

The electronic components 1a, 1b, 1c can also be arranged on the side plates 2b of base plate 2.

Figure 4:
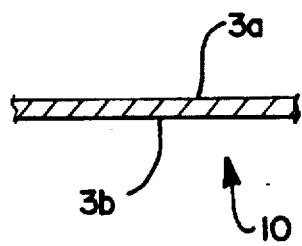
FIG. 4 is a partial cross-sectional view of the ribbon used for making the cooling elements.

According to FIG. 4, the supporting layer 3a of the metal ribbon 10 is 0.9 mm thick and is coated on one side with a 0.1 mm thick layer of solder 3b made of special brazing filler metal; preferably AlSi.

According to FIGS. 2, 5, 6, 7 and 8, the meander-shaped ribbon 3 or the U-shaped profiles 13 are fixed in the longitudinal slots 6 of the base plate 2 by means of straight, stretched pieces of wire 8 (illustrated in FIG. 8). The stretched pieces of wire 8 being clamped in between adjacent profile limbs 13 of the meander-shaped ribbons or profiles 13 respectively by way of permanent deforming in such a way that the meander ends 3c (in the region of the "troughs") or the lower parts of the profile limbs 13a, 13b are slightly bent outwardly near the web portion 13c in the longitudinal slots 6 at an angle of e.g. 50°, so that they are in contact with the inner surfaces of the dovetailed longitudinal slots 6.

According to FIGS. 2, 6 and 7, the pieces of wire 8 are clamped in between the profile limbs 13a, 13b at the bottom of the profiles 13 having a U-shaped cross-section, i.e. on the web portion 13c, and fixed firmly in the longitudinal slots 6.

It is better for the upper ends 2b1 of the side plate 2b or the side limbs to bend inwardly so as to form contact surfaces 2b2 for the ribbon or for the profile's 13 adjacent limb 13b.

Preferred measurements for the preferred embodiment of FIG. 7 are:

e=50.8 mm (height of profile)

f=1 mm (thickness of ribbon)

g=3.15 mm (distance between profiles)

h=5.1 mm (width of profile)

i=30 mm (width of package in he area of the cooling elements)

k=3.1 mm (profiles' internal width between the profile limbs)

A cooling element according to the package 3 of FIG. 7 is manufactured as follows:

At first, the profile segment of the base plate 2, with its longitudinal slots 6 preferably being dovetailed in cross-section (FIG. 8), is extruded using aluminum. Then the bottom or end comprising the web 13c of the four U-shaped profiles 13 is inserted into the longitudinal slots 6. Subsequently, pieces of wire 8, preferably with a square cross-section, are inserted into the spaces between the profile limbs 13a, 13b and are, ideally by means of a common tool such as a press, pushed down to the bottom, i.e. to the web portion 13c of the profiles 13 thereby having to overcome a force or being squeezed and pressed so hard that the adjacent parts of the profile limbs 13a, 13b are permanently deformed and lie flat and clamped against the side walls of the longitudinal slots 6.

The profiles 13 may be made not only of aluminum sheet metal as mentioned above: copper sheet metal or other materials of good heat conductivity are also well suited. Besides aluminum, copper is also suitable for the pieces of wire 8. Alloys of these with other materials or alloys of other materials may also be used.

According to another embodiment of the invention as described in FIG. 9, the profiles 13 are hollow and form substantially rectangular inner and outer cross-sections. Instead of the sharply rectangular cross-sections (shown in FIG. 9), the hollow profiles 13 can also comprise rounded ends 13c, 13d. Each hollow profile 13 extending longitudinally is inserted by the lower ends 13c each into a respective longitudinal slot 6 while the upper closed ends 13d are free and form thermo-exchanging surfaces. The lower ends 13c are connected to the base plate 2 by soldering. For this reason, the outer surface of the hollow profiles 13 is covered with a solder layer as explained above so that by heating the lower ends 13c and the respective inner walls of the slots 6, a good mechanical and a good thermal connection between the hollow profiles 13 and the base plate 2 are guaranteed.

Forming of the hollow profiles 13 is not very complicated. For instance, flat aluminum foils covered with a solder layer according to FIG. 4 are bent four times so that the side ends contact each other to allow soldering longitudinally. Using high frequency welding is preferred in order to form the tube-like hollow profiles 13. The ends opposite the soldered ends can also be removed after soldering to form a profile 13 similar to that found in FIG. 7.

While specific embodiments have been illustrated and described, numerous modifications come to mind without significantly departing from the spirit of the invention and the scope of protection is only limited by the scope of the accompanying claims.

We claim:

1. A cooling device for electrical or electronic components comprising:
   a base plate to which the components to be cooled are connected, the base plate having a longitudinal slot;
   a pair of rib-like cooling elements made of heat-conducting material, the pair of cooling elements being positioned substantially parallel to one another and being spaced by a predetermined distance, the cooling elements having a first end and a second end, the pair of cooling elements having their first ends positioned within the longitudinal slot,
   wherein the pair of cooling elements are interconnected by a first web portion along at their first ends to form a unit having a U-shaped profile in cross-section, the first web portion being positioned within and connected to the longitudinal slot of the base plate, and wherein a stretched piece of wire is positioned over the first web portion to secure the U-shaped profile segments to the longitudinal slots of said base plate.

2. The cooling device of claim 1 wherein the longitudinal slot has inside walls and the piece of wire forces the U-shaped profile to contact the inside walls of said longitudinal slots.

3. The cooling device of claim 2, wherein the longitudinal slot of base plate is dovetailed in cross-section.

4. The cooling device of claim 1, wherein the first ends of the cooling elements are additionally soldered to the base plate.

5. The cooling device of claim 4, wherein the U-shaped profile is made of a composite material including a supporting layer made of heat conducting material and a plated solder layer.

6. The cooling device of claim 1 wherein the supporting layer is made of an aluminum alloy and the solder layer is made of a brazing filler metal.

7. A cooling device for electrical or electronic components comprising:
   a base plate to which the components to be cooled are connected, the base plate having a plurality of longitudinal slots, the slots being separated by a predetermined distance;
   a plurality of pairs of rib-like cooling elements made of heat-conducting material and corresponding to each longitudinal slot, the individual cooling elements forming the pair being substantially parallel to one another, the individual cooling elements each having a first end and a second end, each pair of cooling elements having their first ends placed within their corresponding longitudinal slot,
   wherein each pair of cooling elements are individually interconnected by a first web portion along the first ends of the cooling elements to form a unit having a plurality of U-shaped profiles in cross-section which look like segments of a comb, the first web portion corresponding to each of the pairs of cooling elements being positioned within and connected to its corresponding longitudinal slot, and
   wherein stretched pieces of wire are positioned over the first web portions of the pairs of cooling elements to secure the plurality of U-shaped profile segments to their corresponding longitudinal slots.

8. The cooling device of claim 1, wherein the longitudinal slots have inside walls and the pieces of wire force each U-shaped profile to contact the inside walls of their corresponding longitudinal slots.

9. The cooling device of claim 1 wherein the longitudinal slots have inside walls and the pieces of wire force each U-shaped profile to contact the inside walls of their corresponding longitudinal slots.

10. The cooling device of claim 1 wherein the first ends of each of the cooling elements are soldered to the base plate.

11. The cooling device of claim 10, wherein the U-shaped profiles are made of a composite material including a supporting layer made of heat conducting material and a plated solder layer.

12. The cooling device of claim 9 wherein the supporting layer is made of an aluminum alloy and the solder layer is made of a brazing filler metal.

13. A method for manufacturing a cooling device as claimed in claim 2, comprising the steps of:
   providing the base plate;
   providing the unit;
   inserting the first ends of the cooling elements of the unit and the first web portion of the unit into a longitudinal slot; and
   subsequently pressing a stretched piece of wire onto the first web portion to force the web portion and the first ends of the cooling elements into contact with the slot to secure the unit to the base plate.

14. A method for manufacturing a cooling device as claimed in claim 9, comprising the steps of:
   providing the base plate;
   providing the unit;
   inserting the first ends of the pairs cooling elements of the unit and their corresponding first web portions into their corresponding longitudinal slots; and
   subsequently pressing a stretched piece of wire onto each of the first web portions of the unit to force the web portions and the first ends of the pairs of cooling elements into contact with the slot to secure the unit to the base plate.

* * * * *

UNITED STATES PATENT AND TRADEMARK OFFICE
CERTIFICATE OF CORRECTION

PATENT NO.    : 5,791,406
DATED         : August 11, 1998
INVENTOR(S)   : Johannes Gönner; Joachim Masatz It is certified that errors appear in the above-identified patent and that said Letters Patent is hereby corrected as shown below:

In Column 4, Line 15, replace "50°" with "5°".
In Column 4, Line 32, replace the word "he" with the word "the".
In Column 5, Line 53, replace the words "claim 1" with the words "claim 5".
In Column 6, Line 19, replace the words "claim 1" with the words "claim 7".
In Column 6, Line 23, replace the words "claim 1" with the words "claim 7".
In Column 6, Line 27, replace the words "claim 1"with the words "claim 7".
In Column 6, Line 34, replace the words "claim 9" with the words "claim 11".
In Column 6, Line 49, replace the words "claim 9" with the words "claim 8".

Signed and Sealed this

Eighth Day of February, 2000

*Attest:*

Q. TODD DICKINSON

*Attesting Officer*   *Commissioner of Patents and Trademarks*